United States Patent
Taira et al.

(10) Patent No.: US 10,367,324 B2
(45) Date of Patent: Jul. 30, 2019

(54) LASER COMPONENT

(71) Applicant: INTER-UNIVERSITY RESEARCH INSTITUTE CORPORATION NATIONAL INSTITUTES OF NATUAL SCIENCES, Tokyo (JP)

(72) Inventors: Takunori Taira, Okazaki (JP); Arvydas Kausas, Okazaki (JP); Lihe Zheng, Okazaki (JP)

(73) Assignee: INTER-UNIVERSITY RESEARCH INSTITUTE CORPORATION NATIONAL INSTITUTES OF NATURAL SCIENCES, Tokyo (JP)

( * ) Notice: Subject to any disclaimer, the term of this patent is extended or adjusted under 35 U.S.C. 154(b) by 0 days.

(21) Appl. No.: 15/790,900

(22) Filed: Oct. 23, 2017

(65) Prior Publication Data

US 2018/0123309 A1    May 3, 2018

(30) Foreign Application Priority Data

Oct. 28, 2016 (JP) .................................. 2016-211991

(51) Int. Cl.
*H01S 3/042* (2006.01)
*H01S 3/17* (2006.01)
(Continued)

(52) U.S. Cl.
CPC ............. *H01S 3/042* (2013.01); *B29C 65/16* (2013.01); *B29C 66/00145* (2013.01);
(Continued)

(58) Field of Classification Search
CPC ........ H01S 3/042; H01S 5/02484; H01S 3/17; H01S 5/0216; H01S 3/0405;
(Continued)

(56) References Cited

U.S. PATENT DOCUMENTS

| 5,796,766 A | 8/1998 | Hargis et al. |
| 5,846,638 A | 12/1998 | Meissner |

(Continued)

FOREIGN PATENT DOCUMENTS

| JP | H08-213689 A | 8/1996 |
| JP | 2000-124533 A | 4/2000 |

(Continued)

OTHER PUBLICATIONS

Hiroki Togashi; "Creation and Evaluation of Yb:YAG/Diamond Composite Structured Laser Using Normal Temperature Bonding;" Masters Thesis; Chuo University; 2013.

(Continued)

*Primary Examiner* — Yuanda Zhang
(74) *Attorney, Agent, or Firm* — Oliff PLC

(57) ABSTRACT

A laser component is provided, including a laser medium and a transparent heat transmitting member, at least one of which is oxide. Bonding surfaces of the laser medium and the transparent heat transmitting member are exposed to oxygen plasma, and thereafter the bonding surfaces are brought into contact without heating. The laser medium and the transparent heat transmitting member are bonded at atomic levels, their thermal resistance is low, and no large residual stress is generated due to the bonding taking place under normal temperature. The process of oxygen plasma exposure ensures transparency of their bonding interface. The laser medium and the transparent heat transmitting member are stably bond via an amorphous layer.

21 Claims, 9 Drawing Sheets

(51) Int. Cl.
*H01S 5/02* (2006.01)
*B29C 65/16* (2006.01)
*B29C 65/00* (2006.01)
*H01S 3/04* (2006.01)
*H01S 3/16* (2006.01)
*H01S 5/024* (2006.01)
*G02F 1/35* (2006.01)
*H01S 3/06* (2006.01)
*H01S 3/113* (2006.01)
*H01S 3/108* (2006.01)
*H01S 3/07* (2006.01)

(52) U.S. Cl.
CPC ...... *B29C 66/028* (2013.01); *B29C 66/73772* (2013.01); *G02F 1/3525* (2013.01); *H01S 3/0405* (2013.01); *H01S 3/0612* (2013.01); *H01S 3/0627* (2013.01); *H01S 3/113* (2013.01); *H01S 3/1643* (2013.01); *H01S 3/17* (2013.01); *H01S 5/0216* (2013.01); *H01S 5/02484* (2013.01); *G02F 2001/3505* (2013.01); *G02F 2201/50* (2013.01); *H01S 3/07* (2013.01); *H01S 3/108* (2013.01)

(58) Field of Classification Search
CPC . H01S 3/1643; H01S 3/108; B29C 66/73772; B29C 66/028; B29C 66/00145; B29C 65/16
See application file for complete search history.

(56) References Cited

U.S. PATENT DOCUMENTS

| | | | |
|---|---|---|---|
| 2002/0048442 A1 | 4/2002 | Kondo et al. | |
| 2003/0063638 A1* | 4/2003 | Hasson | H01S 3/042 372/36 |
| 2003/0206565 A1 | 11/2003 | Iwai et al. | |
| 2004/0217670 A1 | 11/2004 | Ueda et al. | |
| 2005/0058174 A1* | 3/2005 | Kadoya | H01S 3/0604 372/68 |
| 2005/0063441 A1* | 3/2005 | Brown | H01S 3/025 372/50.1 |
| 2005/0074040 A1 | 4/2005 | Spence et al. | |
| 2005/0074041 A1 | 4/2005 | Sommerer et al. | |
| 2006/0088067 A1 | 4/2006 | Vetrovec et al. | |
| 2006/0114951 A1* | 6/2006 | Chou | H01S 3/042 372/33 |
| 2007/0110917 A1 | 5/2007 | Okada | |
| 2008/0247425 A1* | 10/2008 | Welford | H01S 3/042 372/10 |
| 2010/0092786 A1* | 4/2010 | Utsumi | B23K 20/02 428/433 |
| 2010/0215063 A1 | 8/2010 | Gao et al. | |
| 2012/0163406 A1 | 6/2012 | Linares | |
| 2012/0236395 A1* | 9/2012 | Shuman | G01N 21/17 359/330 |
| 2013/0026527 A1 | 1/2013 | Ichikawa | |
| 2014/0261955 A1 | 9/2014 | Kadokura et al. | |
| 2015/0137164 A1 | 5/2015 | Ichikawa | |

FOREIGN PATENT DOCUMENTS

| | | |
|---|---|---|
| JP | 2000-221554 A | 8/2000 |
| JP | 2002-040502 A | 2/2002 |
| JP | 2003-295244 A | 10/2003 |
| JP | 2005-084290 A | 3/2005 |
| JP | 2005-294800 A | 10/2005 |
| JP | 2005-350330 A | 12/2005 |
| JP | 2007-508682 A | 4/2007 |
| JP | 2009-210415 A | 9/2009 |
| JP | 2010-134066 A | 6/2010 |
| JP | 2012-088631 A | 5/2012 |
| JP | 2012-146902 A | 8/2012 |
| JP | 2012-248609 A | 12/2012 |
| JP | 2014-032029 A | 2/2014 |
| JP | 2014-135421 A | 7/2014 |
| JP | 2015-097235 A | 5/2015 |
| JP | 2016-082122 A | 5/2016 |
| WO | 2005/030980 A2 | 4/2005 |
| WO | 2009/016703 A1 | 2/2009 |
| WO | 2014/087468 A1 | 6/2014 |

OTHER PUBLICATIONS

Higurashi et. al.; "Surface activated bonding of GaAs and SiC wafers at room temperature for improved heat dissipation in high-power semiconductor lasers;" Japanese Journal of Applied Physics; 2015; vol. 54.
Sato et. al.; "Tailored Spectral Designing of Layer-by-Layer Type Composite Nd:Y3ScAl4O12/Nd:Y3Al5O12 Ceramics;" IEEE Journal of Selected Topics in Quantum Electronics; May/Jun. 2007; vol. 13, No. 3.
Feb. 2, 2018 Office Action issued in British Patent Application No. GB1717631.4.
May 29, 2018 Office Action issued in British Patent Application No. 1717631.4.
Sep. 14, 2018 Office Action issued in German Patent Application No. 102017125099.9.

* cited by examiner

LASER COMPONENT

TECHNICAL FIELD

The description herein discloses a laser component in which a laser medium and a transparent heat transmitting member are bonded, a method of manufacturing the laser component, and a laser device that uses the laser component.

BACKGROUND ART

A solid material is known that emits light when it is radiated with an excitation beam. For example, a solid material doped with rare earth element such as Nd:YAG, Yb:YAG, Tm:YAG, Nd:YVO$_4$, Yb:YVO$_4$, Nd:(s-)FAP, Yb:(s-)FAP, Nd:glass, and Yb:glass, or a solid material doped with transition element such as Cr:YAG and Ti:Al$_2$O$_3$ emit strong light when radiated with the excitation beam. These types of the solid materials may be arranged in a resonator that resonates at a particular wavelength to obtain a laser resonator.

A solid material is also known that emits an output laser beam when it is radiated with an excitation beam and an input laser beam, the output laser beam being amplified from the input laser beam. When this type of the solid material is used, a laser amplifier is thereby obtained. In the description herein, these two types of the solid materials are termed optical gain materials.

Further, a solid material is known that emits an output laser beam with a different wavelength from that of an input laser beam when it is radiated with the input laser beam. When this type of the solid material is used, a wavelength converter is thereby obtained. In the description herein, this type of the solid material is termed a nonlinear optical material.

In the description herein, the optical gain material and the nonlinear optical material will collectively be termed a laser medium.

The laser medium under operation generates heat. Especially the optical gain material generates a large amount of heat due to its quantum defects accompanying excitation. When the laser medium is overheated, resonating efficiency is deteriorated due to uneven distribution of refractive indexes within the laser medium, thermal lens effect caused by thermal expansion, and also issues related to thermal birefringence caused by photoelastic effect, and the laser medium is damaged in the end due to stress thereon. Because of reasons as above, cooling is essential in a solid laser device or the like that uses the solid material. Further, in order to prevent beam quality of the laser beam from being deteriorated, the laser medium not simply needs to be cooled but also preventions are necessary for generation of warping and the like inside the laser medium, and to achieve this measure, the cooling needs to be performed so that a temperature distribution inside the laser medium is uniformized. A cooling technique is essential to facilitate high laser beam output, and a technique configured to cool the laser medium effectively and with a uniform temperature distribution is required.

U.S. Pat. No. 5,796,766 describes a laser component provided with a function to cool a laser medium. In this technique, the laser medium has a circular disc shape, and it transmits heat to a transparent heat transmitting member similarly given a circular disc shape. In the description herein, one flat surface of the circular disc-shaped laser medium will be termed a first end surface, and another flat surface thereof will be termed a second end surface. In the technique of U.S. Pat. No. 5,796,766, a circular disc-shaped first heat transmitting member is brought into contact with the first end surface of the circular disc-shaped laser medium, a circular disc-shaped second heat transmitting member is brought into contact with the second end surface of the circular disc-shaped laser medium, and the laser medium is cooled from both the first and second end surfaces.

U.S. Pat. No. 5,796,766 describes methods for making the laser medium and the heat transmitting member contact each other, including: (1) a method of making both members contact each other by mechanical force (which U.S. Pat. No. 5,796,766 describes as "optical contact"), (2) a method of adhering both members by adhesive, (3) a method of fixing both members by epoxy resin, and (4) a method of diffusion bonding both members.

It has been found from studies conducted by the present inventors that aforementioned methods (1) to (3) cannot sufficiently cool the laser medium due to high thermal resistance between the laser medium and the transparent heat transmitting member. That is, it has been found that the laser beam intensity cannot be increased to a level needed by users of the laser device due to overheating of the laser medium. In case of (1), due to discontinuity of substances at an interface, phonons are dispersed by this discontinuous interface. That is, an increase in the thermal resistance thereby occurs, and this makes it unable to provide essential solution. Further, the adhesive and the epoxy resin layer in (2) and (3) create thermal resistance. Further, they exhibit serious damage issue due to deterioration of the resin upon high-power operation. According to the method of (4), although the thermal resistance between the laser medium and the heat transmitting member can sufficiently be reduced, because they are bonded under a high temperature, a difference in thermal expansion coefficients of the laser medium and the heat transmitting member causes strong residual stress to act on the laser medium under room-temperature operation. The residual stress causes optical distortion in the laser medium which deteriorates beam quality.

In view of the above, a technique of surface-active bonding the laser medium and the transparent heat transmitting member has been developed, and such is described in Hiroki TOGASHI, "Creation and Evaluation of Yb:YAG/Diamond Composite Structured Laser Using Normal Temperature Bonding", Master's Thesis, Chuo University (2013) (hereafter "TOGASHI"). In TOGASHI, YAG which is one type of laser medium and diamond which is one type of transparent heat transmitting member are surface-active bonded. The surface-active bonding may be termed room temperature bonding or normal temperature bonding since the members are brought into contact without heating.

In this description, "surface-active bonding" refers to radiating inert gas atomic beam to bonding surfaces of both members to be bonded to thereby activate the bonding surfaces, bringing the activated bonding surfaces into contact with one another, and causing the two members to bond at their atomic levels by atomic bonds that appeared on the activated bonding surfaces. According to this surface-active bonding method, bonding can be performed under normal temperature, and the issues related to residual stress will not arise. Further, the bonding taking place at atomic levels can sufficiently reduce thermal resistance between the two members. Other references, Eiji HIGURASHI, Ken OKUMURA, Kaori NAKASUJI, and Tadatomo SUGA, "Surface activated bonding of GaS and SiC wafers at room temperature for improved heat dissipation in high power semiconductor lasers", Japanese Journal of Applied Physics, 54 030207 (2015) (hereafter "HIGURASHI et. al") and Yoichi SATO, Akio IKESUE and Takunori TAIRA, "Tailored Spectral Designing of Layer-by Layer Type Composite Nd:$Y_3ScAl_4O_{12}$/Nd: $Y_3Al_5O_{12}$ Ceramics", IEEE Journal of Selected Topics in Quantum Electronics, Vol. 13, No. 3 May/June (2007) (hereafter "SATO et. al"), will be described later.

SUMMARY

In the technique of TOGASHI, if YAG and diamond could be bonded in a satisfactory state by the conventional surface-active bonding, the laser medium could be efficiently and uniformly cooled, and it could be a revolutionary technique enabling high power output from the laser device. However, in reality, an optically deteriorated layer such as a colored layer or the like is generated at an interface of YAG and diamond that are bonded by using the conventional surface-active bonding. Further, bonding reliability of YAG and diamond is low, and a long-term use deteriorates the bonding interface. These problems are not limited to the case where the laser medium is YAG. When the laser medium is oxide, oxygen defect occurs upon a surface activating process due to light elements such as oxygen being removed, and it is assumed that the optically deteriorated layer such as the colored layer or the like is generated due to this oxygen defect. The optically deteriorated layer such as the colored layer also appears at the bonding interface when the transparent heat transmitting member is constituted of oxides. If one of or both of the laser medium and the transparent heat transmitting member are oxides, bonding thereof may not be durable, or a phenomenon in which their bonding surfaces become colored may occur with the conventional surface-active bonding, and it is thus difficult to bond them while maintaining transparency.

Studies conducted by the present inventors have enabled high power output, with its peak value in a resonator reaching several ten MW (megawatts), by using a microchip laser device with a length of a few mm. In general optical systems, a loss of about 1% is allowed. However, when power thereof reaches several ten MW, the loss of 1% would be equaling absorbing power of several hundred kW; and optical components in the system may be damaged. A trivial loss leads to serious accidents with high intensity laser, and as such, loss or absorption at a degree that would be allowable in general is not tolerable for the high intensity laser device. The colored layer appearing at the bonding interface of YAG and diamond in the technique of TOGASHI is thin, however, such a trivial colored layer brings forth a loss in the high intensity laser beam, which hinders the microchip laser device from achieving high power output. The conventional surface-active bonding cannot achieve the interface transparency at a level required for laser components for high intensity laser device.

Further, when the laser medium and the transparent heat transmitting member are surface-active bonded, surface-active bonding between heterogeneous materials is performed. When one of or both of the members is oxide, it becomes difficult to surface-active bond the heterogeneous materials. HIGURASHI et. al reports a case study of heterogeneous surface-active bonding that bonds GaAs, being one type of laser medium, and SiC, being one type of heat transmitting member. According to HIGURASHI et. al, GaAs and SiC are surface-active bonded under a state in which an amorphous layer is intervened between GaAs and SiC. When the amorphous layer is provided between the two members, bonding reliability can be achieved. However, when one of or both of the members are oxide, it becomes difficult to stably perform the surface-active bonding of the heterogeneous materials via the amorphous layer even if the surface-active bonding method described in HIGURASHI et. al is employed.

The description herein discloses a technique that employs oxide for at least one of a laser medium and a transparent heat transmitting member, and that provides a solution to a problem by the conventional surface-active bonding technique. The disclosed technique realizes a transparent bonding interface that can be used for high intensity laser device.

Further, the description herein discloses a laser component: that has a low thermal resistance between a laser medium and a transparent heat transmitting member, at least one of which is oxide; in which a strong residual stress does not act on the laser medium after bonding; and that has high transparency at an interface between the laser medium and the transparent heat transmitting member, that is, a laser component with low loss that is suitable for high intensity laser device is herein disclosed. Further, a method of manufacturing this laser component, and a laser device using this laser component are disclosed.

Moreover, the description herein discloses a laser component: that has a low thermal resistance between a laser medium and a transparent heat transmitting member, at least one of which is oxide; in which a strong residual stress does not act on the laser medium after bonding; and in which the laser medium and the transparent heat transmitting member are stably bonded via an amorphous layer, that is, a laser component capable of enduring long-term use with high intensity laser device is herein disclosed. Further, a method of manufacturing this laser component, and a laser device using this laser component are disclosed.

(Method of Manufacturing Laser Component)

The description herein discloses a new method of manufacturing a laser component in which a laser medium and a transparent heat transmitting member are bonded, and at least one of the laser medium and the transparent heat transmitting member is oxide. The method comprises: exposing both of a bonding surface of the laser medium and a bonding surface of the transparent heat transmitting member to oxygen plasma; radiating inert gas atomic beam to both of the bonding surfaces of the laser medium and the transparent heat transmitting member in vacuum after the exposing; and surface-active bonding the bonding surfaces of the laser medium and the transparent heat transmitting member by bringing the bonding surfaces into contact after the radiating.

In a conventional surface-active bonding, it had been difficult to surface-active bond the laser medium and the transparent heat transmitting member when at least one of the laser medium and the transparent heat transmitting member is oxide. In the aforementioned manufacturing method, the exposing of both of the bonding surfaces to the oxygen plasma is performed prior to the surface-active bonding. By carrying out this pre-processing step, the laser medium and the transparent heat transmitting member can suitably and stably be surface-active bonded even if at least one of the laser medium and the transparent heat transmitting member is oxide (for example, even if at least one of them is YAG). That is, by carrying out this pre-processing step, transparency of a bonding interface of the laser medium and the transparent heat transmitting member can be prevented from being deteriorated. Further, by carrying out this pre-processing step, the laser medium and the transparent heat transmitting member are stably bonded via an amorphous layer, and bonding reliability is thereby improved.

(Laser Component in which No Colored Layer is Observed)

According to the technique disclosed herein, since the surface-active bonding can suitably be carried out even if at least one of the laser medium and the transparent heat transmitting member is oxide, a laser component in which no clouded layer or colored layer is observed at the interface can be obtained. The laser component disclosed herein has a fine or clear transparency at the interface of the laser medium and the transparent heat transmitting member, that is, no clouded layer or colored layer is observed at the interface. The description herein collectively describes clouding and coloring as "coloring".

According to this laser component, the laser component can be prevented from being damaged due to an optical loss at the interface even if the laser component is used for high intensity laser device.

(Laser Component Using Amorphous Layer)

According to the technique disclosed herein, a laser component that bonds a laser medium and a transparent heat transmitting member by the surface-active bonding, in which at least one of the laser medium and the transparent heat transmitting member is oxide, and in which the laser medium and the transparent heat transmitting member are stably bonded via an amorphous layer, can be achieved. High intensity laser beam can path the laser medium, the amorphous layer and the transparent heat transmitting member without substantial energy loss. According to this laser component, the bonding reliability is ensured even if it is used for the high intensity laser device and a long-term use becomes enabled.

Since it has been found that the "laser component in which no colored layer is observed" and the "laser component in which heterogeneous materials are bonded via an amorphous layer" as aforementioned can be realized by the exposure to the oxygen plasma, other methods were also investigated. As a result, it was found that a method that carries out surface-active bonding after having cleaned the bonding surfaces using gel is also effective, and the aforementioned laser components can be realized also by this method.

The laser medium and the transparent heat transmitting member may directly be surface-active bonded. Heterogeneous materials can be surface-active bonded. The surface-active bonding may be carried out after having provided a dielectric multilayer film on one of or both of the laser medium and the transparent heat transmitting member. When the dielectric multilayer film is used, a reflection property at the interface of the laser medium and the transparent heat transmitting member can be adjusted. For example, it becomes possible to adjust to a property by which high reflectance is exhibited for a specific wavelength and low reflectance is exhibited for other wavelengths. When the dielectric multilayer film is to be provided, a film constituted of a homogeneous material as the counterpart bonding surface (homogeneous film) may be provided on an outermost surface of the dielectric multilayer film. In this case, the dielectric multilayer film covered with the homogeneous film and the bonding surface of its counterpart can be bonded by homogeneous surface-active bonding. The dielectric multilayer film and the bonding surface of its counterpart member can be bonded by heterogeneous surface-active bonding without the homogeneous film.

When a difference in refractive indexes of the laser medium and the transparent heat transmitting member is equal to or more than 9%, a reflection loss at the interface becomes more than 0.3%, and usage of the laser component is thereby limited. In such a case, it is preferable to use an intermediate layer having a refractive index that is close to a median value of the refractive indexes of the laser medium and the transparent heat transmitting member. That is, an intermediate layer that establishes relationships in which a difference in the refractive indexes of the laser medium and the intermediate layer is less than 9%, and a difference in the refractive indexes of the intermediate layer and the transparent heat transmitting member is also less than 9% is used. By so doing, a laser component of which loss at the interface is less than 0.3% can be achieved. Especially in cases where the laser medium is $YVO_4$ and the transparent heat transmitting member is diamond, this technique of using the intermediate layer is effective.

In case of using the intermediate layer, the laser medium and the transparent heat transmitting member may be bonded by homogeneous surface-active bonding by providing intermediate layers on both of the bonding surfaces of the laser medium and the transparent heat transmitting member. Two levels of intermediate layers may be provided by configuring the intermediate layer on a laser medium side and the intermediate layer on a transparent heat transmitting member side differently. If the difference in the refractive indexes of the laser medium and the transparent heat transmitting member is large, two levels of intermediate layers, namely an intermediate layer having the refractive index close to that of the laser medium and an intermediate layer having the refractive index close to that of the transparent heat transmitting member, may be used together. Alternatively, an intermediate layer or intermediate layers may be provided on one of the bonding surfaces of the laser medium and the transparent heat transmitting member, and these members may be bonded by heterogeneous surface-active bonding. Prior to formation of the intermediate layer, a dielectric multilayer film may be provided. In cases of forming one or more films on one of the members and performing the bonding thereafter, the one or more films may be provided on the transparent heat transmitting member and the laser medium is bonded thereto, or the one or more films may be provided on the laser medium and the transparent heat transmitting member is bonded thereto. In both cases, bonding surfaces with excellent quality can be obtained by pre-prosessing the bonding surfaces by exposing them to the oxygen plasma and thereafter bonding them. The exposure to the oxygen plasma may be performed after having provided the intermediate layer(s), or the intermediate layer(s) may be formed after the exposure to the oxygen plasma.

According to the technique disclosed herein, a laser component may be provided in which a plurality of laser mediums and a plurality of transparent heat transmitting members are provided, and the plurality of laser mediums and the plurality of transparent heat transmitting members are arranged serially in an order by which the laser medium and the transparent heat transmitting member appear alternately. This type of laser component is useful for laser resonators, laser amplifiers, and wavelength converters.

In case of arranging the plurality of laser mediums serially, same laser mediums may be arranged, or the laser mediums may be configured differently. For example, dopant concentration of a laser medium arranged on an incident side of an excitation beam may be set low, and dopant concentration of a laser medium arranged on an opposite side may be set high. When a relationship in which dopant concentration is low at a position where an excitation beam intensity is high and dopant concentration is high at a position where the excitation beam intensity is low is satisfied, a difference in heat emission depending on positions can be suppressed small, and an occurrence of local overheating can be suppressed. This structure is effective for laser amplifiers. When excitation beams are inputted to a stack of the plurality of laser mediums from both end surfaces, dopant concentration at positions cross to the end faces should be low, and dopant concentration at positions far away from the end faces should be high. In this arrangement, dopant concentration is low at a position where the excitation beam intensity is high, and dopant concentration is high at a position where the excitation beam intensity is low, therefore, difference in heat generation depending on positions can be suppressed.

A wavelength converter in which nonlinear optical materials having different thicknesses are arranged serially is also useful. A wavelength converter that can be used with plural input laser beams with different wavelengths can be realized.

A laser resonator or a laser amplifier in which laser mediums of different types are arranged serially are also useful. For example, when optical gain materials of different types, which added a common luminescence center substance in different types of base materials, are arranged serially, a resonating wavelength of the laser resonator can be configured as a broad band as described in SATO et. al. The technique of SATO et. al is limited to a combination of two types of ceramic optical gain materials, however, the technique disclosed herein is not limited to ceramic materials, and a number of types is not limited, and a structure in which transparent heat transmitting members are arranged between optical gain materials to perform cooling can be achieved.

In cases of serially arranging the plurality of laser mediums and the plurality of transparent heat transmitting members, it is preferable in some cases to arrange the transparent heat transmitting members at respective ends of such serial arrangement. In a laser device, an electric field accumulation easily occurs in a vicinity of an interface between a laser medium and a space due to their discontinuity. When the intensity of the laser beam increases, a degree of the electric field accumulation becomes greater, and the laser medium may be damaged by the electric field accumulation generated in the vicinity of the interface between the laser medium and the space. This issue becomes prominent for cases where the laser mediums are amorphous or ceramics. This is because a presence of grain boundaries creates regions that are inherently uneven in a planar distribution of an electric field in a vicinity of such boundaries. Further, even if end surfaces are uniformized by polishing or the like, crystal grains and grain boundaries have different polishing speeds, and further, hardness also becomes different depending on orientations even for a same type of crystal grains. Thus, as compared to a material constituted of one uniform region as a whole, especially by a single crystal, a surface precision of the ceramic materials is inferior. Due to this, even if coating to alleviate the electric field accumulation that may occur at the end surfaces is performed, the inferior surface precision of base layers thereof causes a surface precision of coated surfaces to be inferior as well. Due to this, an optical damage threshold of ceramic laser mediums is reduced by about one digit as compared to that of single crystal. In cases where a peak value exceeds several megawatts, especially as with giant pulse laser, a failure mode thereof is grave and it can essentially affect laser performance. Thus, an optical damage resistivity can be increased by surface-active bonding a uniform material, especially a transparent mono crystals or a transparent single crystal, to the end surfaces of the ceramic laser mediums. Providing coating on the end surfaces of the transparent mono crystals or transparent single crystal further increases damage resistivity. Heat discharging effect can also be increased by bonding transparent heat transmitting members to the end surfaces of the serial arrangement and high-performance power laser device is enabled as a whole.

When the laser medium is made of ceramic, bonding the transparent material of mono crystals or a single crystal to both end faces of the ceramic laser medium is effective to increase damage resistivity. When the laser medium and the transparent material are repeatedly and sequentially stacked, bonding the transparent materials to both end faces of the stack is effective to increase damage resistivity. It is also effective that the transparent material is made of mono crystals or a single crystal, and the transparent material has high heat conductivity.

DETAILED DESCRIPTION

Figure 1:
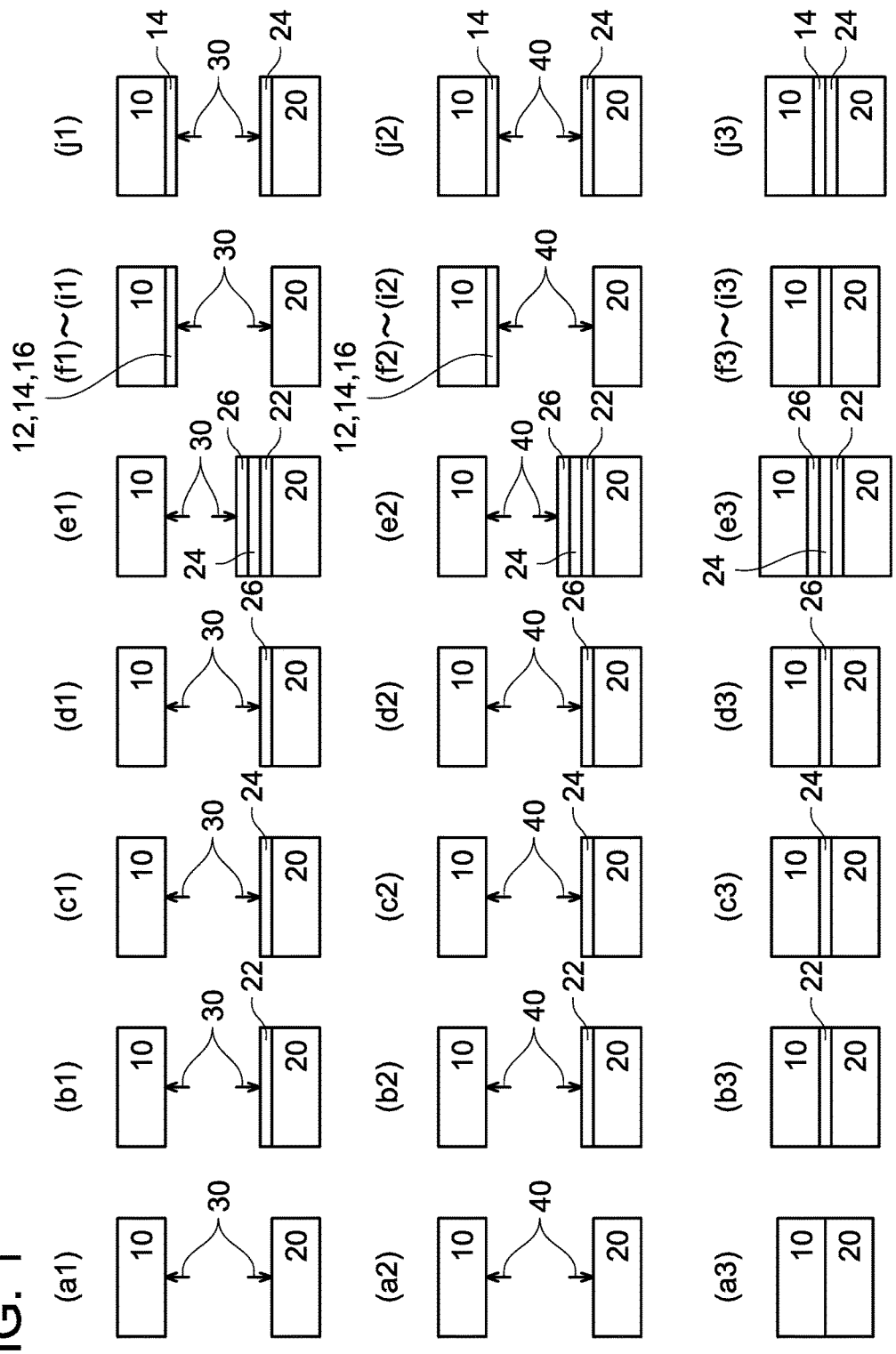
FIGS. 1(a1) to 1(a3)-1(j1) to 1(j3) schematically show various embodiments.

FIG. 1 of (a1) to (a3)-(j1) to (j3) show various embodiments. Alphabets in FIG. 1 show types of embodiments, and numbers show process orders of manufacturing method. FIG. 1 of (a1) to (a3) show a combination of a laser medium 10 and a transparent heat transmitting member 20 that are bonded by heterogeneous surface-active bonding, and show a case in which a difference between refractive indexes of these members is less than 9%. In this case, the laser medium 10 and the transparent heat transmitting member 20 can directly be bonded by heterogeneous surface bonding. A reference sign 30 in FIG. 1 of (a1) to (j1) shows that bonding surfaces of these members are exposed to oxygen plasma. By adding this pre-processing, transparency of an interface after having bonded them can be maintained at a high level. Further, combinations of materials that cannot be surface-active bonded without performing this pre-processing can be surface-active bonded. For example, although it is difficult to surface-active bond YAG and sapphire stably, YAG and sapphire can be stably bonded by heterogeneous surface-active bonding by performing the pre-processing. When the heterogeneous surface-active bonding is performed, an amorphous layer is formed at the interface. An amorphous layer is very thin, and its depiction will be omitted from the drawings.

Oxygen plasma radiation is for cleaning the bonding surfaces, and it aims to achieve a same effect as inert gas atomic beam radiation to be described later. Due to this, in a conventional surface-active bonding, both the oxygen plasma radiation and the inert gas atomic beam radiation were not carried out in combination. Further, in a surface activating process, oxygen must be removed from an outermost surface layer of a bonding face which is stabilized by bonding with the oxygen. It is a natural assumption that the oxygen will not be removed by the use of the oxygen plasma, therefore, a concept of oxygen plasma exposure was never considered. According to the studies herein, it has been found that transparency deterioration at the interface can be prevented and a variety of surface-active-bondable materials can be increased by adding the oxygen plasma radiation before the conventional surface-active bonding. Further, in the case of heterogeneously bonding the laser medium and the transparent heat transmitting member, they bond firmly via the amorphous layer.

Note that a reference sign 40 in FIG. 1 of (a2) to (j2) show that argon ion beam is radiated onto the bonding surface of the laser medium 10 and the bonding surface of the transparent heat transmitting member 20, and FIG. 1 of (a3) to (j3) show a laminate structure of a laser component in which the laser medium 10 and the transparent heat transmitting member 20 are surface-active bonded. As aforementioned, the depiction of the amorphous layer is omitted. Inert gas other than argon may be used.

FIG. 1 of (b1) to (b3) show an embodiment in which a dielectric multilayer film 22 is formed on a surface of the transparent heat transmitting member 20, the oxygen plasma exposure is performed thereafter, and the heterogeneous surface-active bonding is performed thereafter. By using the dielectric multilayer film 22, a reflection property at the bonding interface can be adjusted. In this case as well, an amorphous layer that is not shown is formed between an upper surface of the dielectric multilayer film 22 and a lower surface of the laser medium 10.

FIG. 1 of (c1) to (c3) show an embodiment in which an intermediate layer 24 is formed on the surface of the transparent heat transmitting member 20, the oxygen plasma exposure is performed thereafter, and the heterogeneous surface-active bonding is performed thereafter. In a case where the difference between the refractive indexes of the laser medium 10 and the transparent heat transmitting member 20 is equal to or more than 9%, a loss at the interface becomes problematic. In such a case, it is preferable to produce the intermediate layer 24 with a material having a refractive index that is close to a median value of the refractive indexes of the laser medium 10 and the transparent heat transmitting member 20, with which a difference from the refractive index of the laser medium 10 is less than 9% (preferably less than 6%), and a difference from the refractive index of the transparent heat transmitting member 20 is also less than 9% (preferably less than 6%). By containing the difference in the refractive indexes less than 6%, the loss at the interface can be suppressed to less than 0.1%. If the difference between the refractive indexes of the laser medium 10 and the transparent heat transmitting member 20 is less than 9%, the loss at the interface is less than 0.3%, and as shown in FIG. 1(a), 1(b), 1(d), the intermediate layer 24 may not be provided. If the difference between the refractive indexes of the laser medium 10 and the transparent heat transmitting member 20 is 6 to 9%, there is a significance in using the intermediate layer 24 with the refractive index of which difference from each of the refractive indexes of the laser medium 10 and the transparent heat transmitting member 20 is less than 6%. When such an intermediate layer 24 is used, the loss at the interface can be suppressed to less than 0.1%. In this case as well, an amorphous layer that is not shown is formed between an upper surface of the intermediate layer 24 and the lower surface of the laser medium 10.

The intermediate layer 24 may be formed after having exposed the laser medium 10 and the transparent heat transmitting member 20 to the oxygen plasma and further exposed them to inert gas atomic beam. The surface-active bonding thereof can be performed in an order of the radiation to the inert gas ion, the formation of the intermediate layer 24, and bringing the laser medium 10 and the transparent heat transmitting member 20 into contact and applying pressure thereto.

FIGS. 1(d1) to (d3) show an embodiment in which a film 26 having a same composition as the laser medium 10 (hereafter referred to as homogeneous film 26) is formed on the surface of the transparent heat transmitting member 20, after which the oxygen plasma exposure is performed, and homogeneous surface-active bonding is performed thereafter.

FIGS. 1(e1) to (e3) show an embodiment in which the dielectric multilayer film 22, the intermediate layer 24, and the homogeneous film 26 are formed on the surface of the transparent heat transmitting member 20 in this order, after which the oxygen plasma exposure is performed, and the homogeneous surface-active bonding is performed thereafter. The dielectric multilayer film 22 may be omitted if the reflection property at the interface is not an issue. If the difference between the refractive indexes of the laser medium 10 and the transparent heat transmitting member 20 is less than 9%, the intermediate layer 24 may be omitted. If the heterogeneous bonding can be performed, the homogeneous film 26 may be omitted.

FIGS. 1(f1) to (f3), 1(g1) to (g3), (h1) to (h3) and (i1) to (i3) show cases in which a dielectric multilayer film 12, an intermediate layer 14, a homogeneous film 16 or a combination of these layers is formed on the laser medium 10. A same component as shown in FIG. 1(b3) can be obtained if the dielectric multilayer film 12 is formed, a same component as shown in FIG. 1(c3) can be obtained if the intermediate layer 14 is formed, a same component as shown in FIG. 1(d3) can be obtained if the homogeneous film 16 is formed, and a same component as shown in FIG. 1(e3) can be obtained if all of the dielectric multilayer film 12, the intermediate layer 14, and the homogeneous film 16 are formed.

FIGS. 1(j1) to (j3) show an embodiment in which the intermediate layers 14, 24 are formed respectively on the laser medium 10 and the transparent heat transmitting member 20. The intermediate layers 14 and 24 may have a same composition. In this case, the intermediate layers 14, 24 serve a same role as the homogeneous films 16, 26, and the homogeneous surface-active bonding can be performed. The intermediate layers 14, 24 may have different compositions. In this case, reflection loss becomes less than 0.3% if refractive indexes vary in an order of the laser medium 10, the first intermediate layer 14, the second intermediate layer 24, and the transparent heat transmitting member 20, and differences between the refractive indexes at respective interfaces thereof are less than 9%. The reflection loss of less than 0.1% is achieved if the differences between the refractive indexes at respective interfaces are less than 6%. In this case, an amorphous layer that is not shown in formed between a lower surface of the first intermediate layer 14 and an upper surface of the second intermediate layer 24.

If the intermediate layers 14, 24 do not serve the role of the homogeneous films, a homogeneous film may be formed on one of or both of the intermediate layers 14, 24. Further, in addition to the intermediate layers 14, 24, one of or both of the dielectric multilayer films 12, 22 may be formed.

The technique disclosed herein can be applied to laser components having a combination of YAG and sapphire, or a combination of YVO$_4$, an intermediate layer, and diamond, or the like.

Embodiments (First Embodiment)

Figure 2:
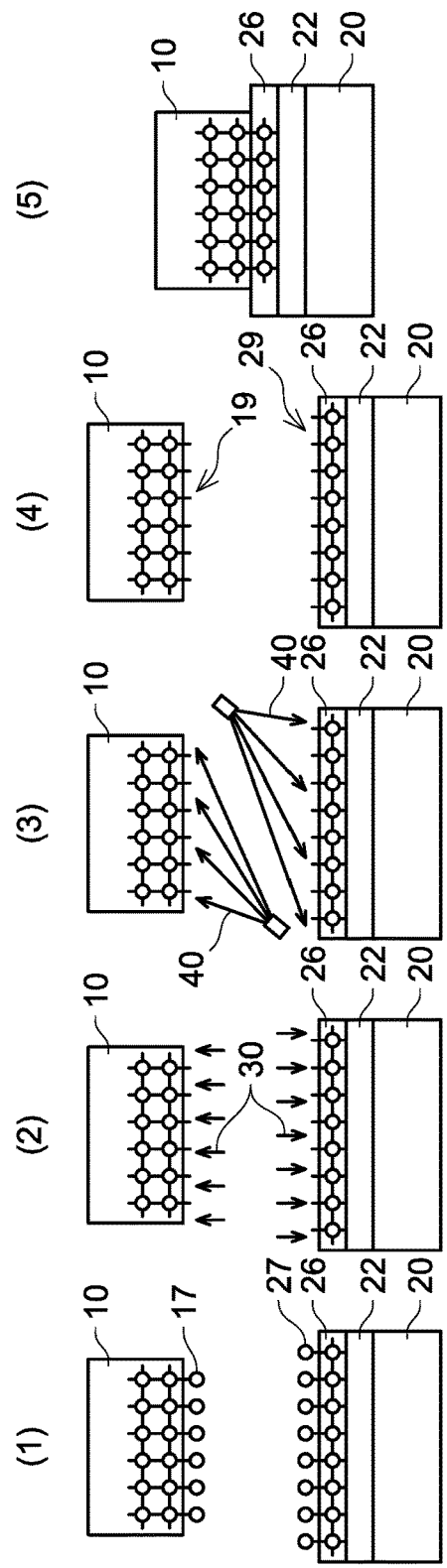
FIGS. 2(1)-2(5) show a laser component of a first embodiment and a manufacturing method thereof.

FIGS. 2(1) to 2(5) show an embodiment that combined FIGS. 1(b) and 1(d), and in which the intermediate layer 24 of FIG. 1(e) is omitted. The laser medium 10 is YAG (refractive index=1.82), and the transparent heat transmitting member 20 is sapphire (refractive index=1.75). A difference between the refractive indexes of these members is 3.8% (less than 6%), and this corresponds to a case where the intermediate layer 24 is not necessary. Here, the difference in the refractive indexes is calculated by a formula of (difference between higher refractive index and lower refractive index) divided by (higher refractive index).

In this embodiment, the dielectric multilayer film 22 is formed on a surface of a sapphire substrate that is to be the transparent heat transmitting member 20, and a YAG thin film that is to be the homogeneous film 26 is formed on a surface of the dielectric multilayer film 22. These films are both formed by sputtering. These samples are exposed to oxygen plasma 30 (FIG. 2(2)), and an environment in which these samples are places is set to be in vacuum, high-speed argon ion beam 40 is radiated to the bonding surfaces of these samples (FIG. 2(3)), and the bonding surfaces after the aforementioned radiation are brought into contact and pressurized (FIG. 2(5)). Bringing the bonding surfaces into contact may be processed without heating, that is, under room temperature. By so doing, the homogeneous film 26 and the laser medium 10 are bonded by the homogeneous surface-active bonding, and they are bonded in a state where a thermal resistance between the laser medium 10 and the transparent heat transmitting member 20 is low. In FIG. 2(1), reference signs 17 and 27 show sample surfaces placed in atmospheric environment, and they are surfaces stabilized by bonding with oxygen and the like. A reference sign 30 shows the oxygen plasma radiation, and a reference sign 40 shows high-speed argon ion beam radiation. When these processes are carried out, as shown in FIG. 2(4), activated atomic bonds 19, 29 appear on the bonding surfaces of the materials, and the materials are bonded at atomic levels by these atomic bonds being bonded to each other. Since the pre-processing of the oxygen plasma exposure is carried out, the bonding surface of YAG (laser medium 10), which is constituted of oxide, does not transform in regard to its quality by the surface-active bonding, so transparency of an interface between YAG and sapphire substrate does not deteriorate. Further, since the surface-active bonding is carried out under a normal temperature, no large residual stress acts on YAG (laser medium 10).

(Second Embodiment)

Figure 3:
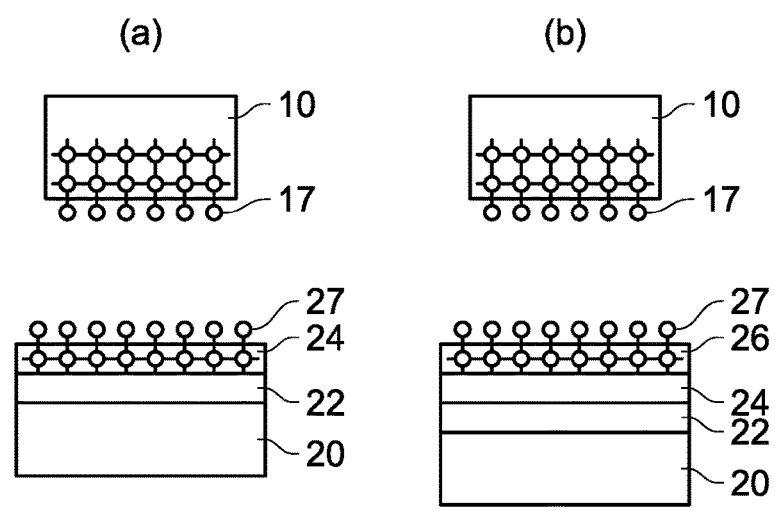
FIGS. 3(a) and 3(b) explain laser components of second and third embodiments.

FIG. 3(a) shows a diagram of second embodiment corresponding to FIG. 2(1). The laser medium 10 is YAG (refractive index=1.82), the transparent heat transmitting member 20 is diamond (refractive index=2.42), and a difference in their refractive indexes is 24.8% (more than 9%), which corresponds to a case where the intermediate layer 24 is necessary. The intermediate layer is not limited to one layer, and it may be constituted of plural layers. When two layers are used, a difference in refractive indexes of the laser medium 10 and the first intermediate layer, a difference in refractive indexes of the first intermediate layer and the second intermediate layer, and a difference in the refractive indexes of the second intermediate layer and the transparent heat transmitting member can all be suppressed less than 9%. For example, when sulfa is used for the first intermediate layer and TiO$_2$ is used for the second intermediate layer, the difference in the refractive indexes of the adjacent members can be suppressed roughly within 9%, and an optical loss can thereby be suppressed. In this case, an amorphous layer that is not shown is formed between an upper surface of the intermediate layer 24 and a lower surface of the YAG 10, and thus the bonding therebetween is established stably. The dielectric multilayer film 22 may be omitted.

(Third Embodiment)

As shown in FIG. 3(b), all of the dielectric multilayer film 22, the intermediate layer 24, and the homogeneous film 26 may be used.

(Fourth Embodiment)

Figure 4:
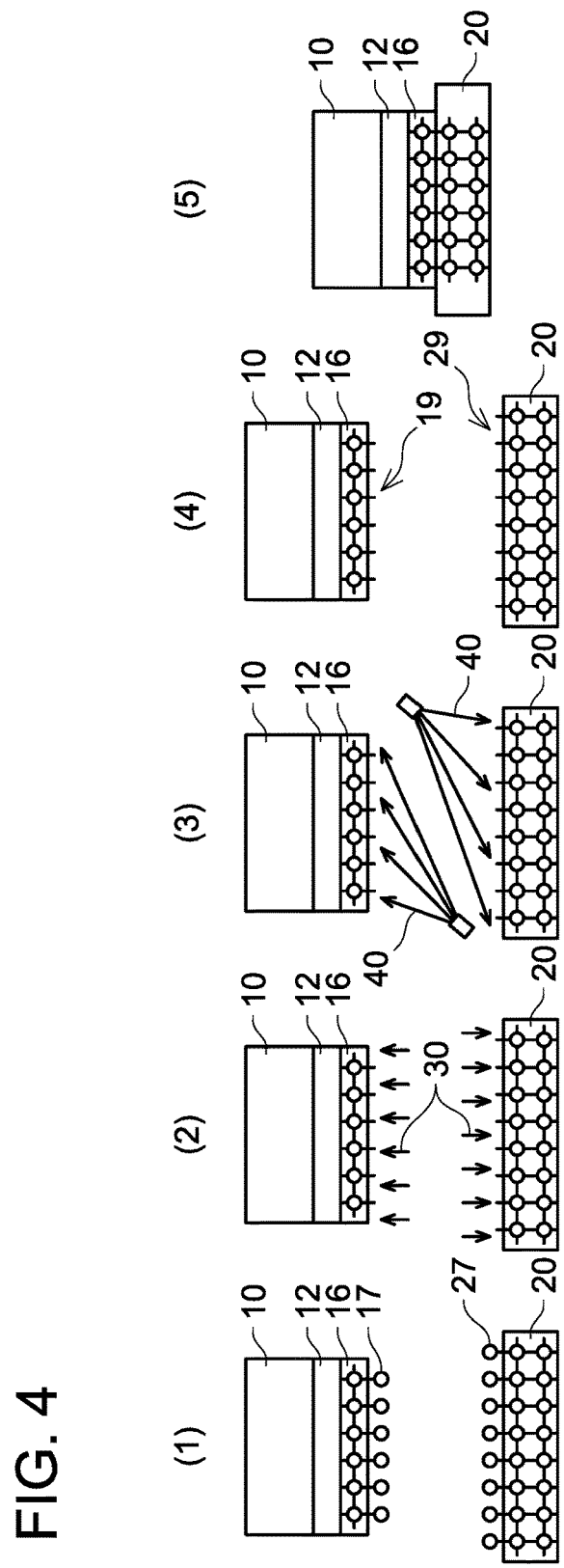
FIGS. 4(1)-4(5) show a laser component of a fourth embodiment and a manufacturing method thereof.

FIGS. 4(1) to 4(5) show an embodiment in which the dielectric multilayer film 12 and the homogeneous film 16 are provided on the laser medium 10 side. The dielectric multilayer film 12 corresponds to the dielectric multilayer film 22 in FIG. 2 and the homogeneous film 16 corresponds to the homogeneous film 26 in FIG. 2. A same effect as that of the case of FIGS. 2(1) to (5) can be achieved.

(Fifth Embodiment)

Figure 5:
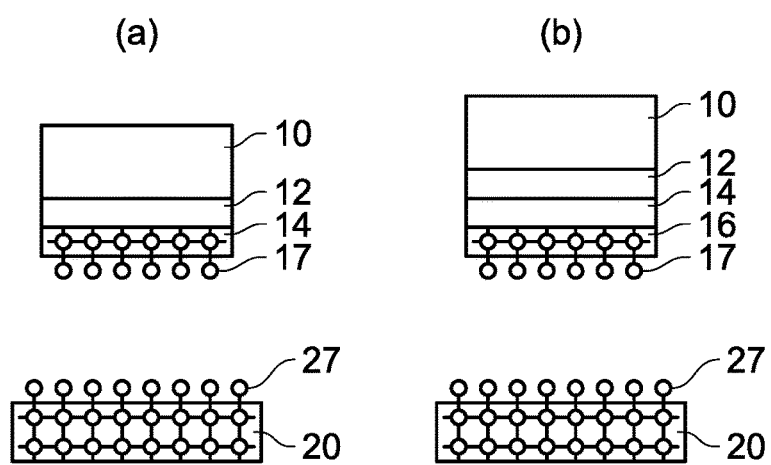
FIGS. 5(a) and 5(b) explain laser components of fifth and sixth embodiments.

FIG. 5(a) shows an embodiment in which the intermediate layer 14 corresponding to the intermediate layer 24 in FIG. 3(a) is provided on the laser medium 10 side. A same effect as that of the case of FIG. 3(a) can be achieved. In this case, an amorphous layer that is not shown is formed between a lower surface of the intermediate layer 14 and an upper surface of the transparent heat transmitting member 20, and thus the bonding therebetween is established stably.

(Sixth Embodiment)

FIG. 5(b) shows an embodiment in which the dielectric multilayer film 12 corresponding to the dielectric multilayer film 22 in FIG. 3(b), the intermediate layer 14 corresponding to the intermediate layer 24 in FIG. 3(b) and the homogeneous film 16 corresponding to the homogeneous film 26 in FIG. 3(b) are provided on the laser medium 10 side. A same effect as that of the case of FIG. 3(b) can be achieved.

(Seventh Embodiment)

Figure 6:
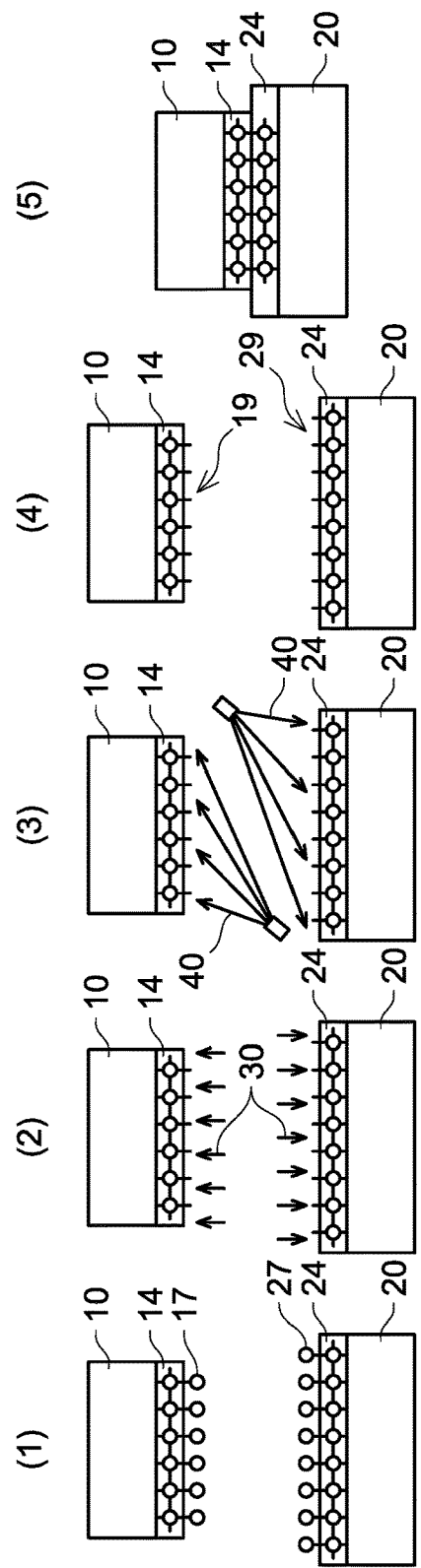
FIGS. 6(1)-to 6(5) explain a laser component of a seventh embodiment and a manufacturing method thereof.

FIGS. 6(1) to 6(5) show an embodiment in which the intermediate layer 14 is provided on the bonding surface of the laser medium 10, and the intermediate layer 24 is provided on the bonding surface of the transparent heat transmitting member 20.

The intermediate layer 14 and the intermediate layer 24 may also serve as homogeneous films. Alternatively, the intermediate layers 14 and 24 may configure two-layers structure of the intermediate layer that alleviate the difference in the refractive indexes by two different levels. In this case, an amorphous layer that is not shown is formed between the intermediate layer 14 and the intermediate layer 24, and thus the bonding therebetween is established stably.

Various types of known laser mediums may be used. For instance, oxide with rare earth dopant, oxide with transitional metal dopant and oxide that works as a color center and the like may be used as an optical gain material. Ce, Pr, Nd, Pm, Sm, Eu, Gd, Tb, Dy, Ho, Er, Tm, and Yb may be exemplified as the rare earth dopant to be a luminescent center. Ti, V, Cr, Mn, Fe, Co, Ni, and Cu may be exemplified as the transitional metal dopant to be the luminescent center. Garnet-based materials such as YAG, YSAG, YGAG, YSGG, GGG, GSGG, and LuAG, fluoridated materials such as YLF, LiSAF, LiCAF, $MgF_2$, and $CaF_2$, vanadate-based materials such as $YVO_4$, $GdVO_4$, and $LuVO_4$, apatite-based materials such as FAP, sFAP, VAP, and sVAP, alumina-based materials such as $Al_2O_3$ and $BeAl_2O_3$, dioxide or trioxide-based materials such as $Y_2O_3$, $Sc_2O_3$, and $Lu_2O_3$, and tungstate-based materials such as KGW, KYW may be exemplified as types of a base material. The base material may be mono crystals a single crystal, an amorphous or a ceramic material. Further, it may be various types of non-crystalline glass. LN, LT, KTP, KTA, RTP, RTA, LBO, CLBO, CBO, BBO, BiBO, KBBF, BABF, crystallized quartz, COB, YCOB, GdCOB, GdYCOB, YAB, KDP, KD*P, and ZGP may be exemplified as a nonlinear optical material.

Sapphire, diamond, and dopant-free YAG may be exemplified as the transparent heat transmitting member. Sic may also be used as the transparent heat transmitting member, however, the transparency thereof is insufficient as of this day so its use is limited, such as to arrange it outside a resonator. $PbCl_2$, $Ta_2O_5$, $TiO_2$, $HfO_2$, ZnS, ZnSe, $NdO_2$, and $ZrO_2$ may be exemplified as the intermediate layer for diamond. $Al_2O_3$, $Y_2O_3$, $La_2O_3$, MgO, $PbF_2$, $Sc_2O_3$, and YAG may be exemplified as the intermediate layer for sapphire.

Next, laser devices that use laser components will be described.

(Laser Device of First Embodiment)

Figure 7:
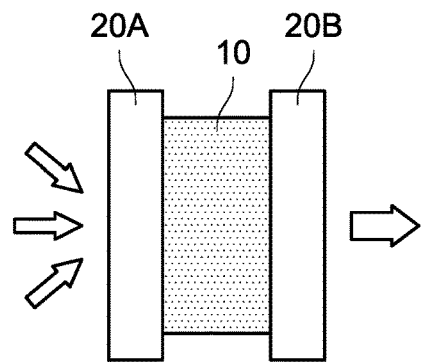
FIG. 7 shows a laser device of a first embodiment.

FIG. 7 shows a so-called microchip laser resonator. A transparent heat transmitting member 20A is surface-active bonded to a left end surface of the laser medium 10, and a transparent heat transmitting member 20B is surface-active bonded to a right end surface of the laser medium 10. Although not shown, dielectric multilayer films are formed on left end surface of the transparent heat transmitting members 20A and right end surface of the transparent heat transmitting members 20B, and reflection properties at interfaces thereof are adjusted as follows:

the left end surface of the transparent heat transmitting member 20A is nonreflective to an excitation beam wavelength but highly reflective to a laser beam wavelength;

the right end surface of the transparent heat transmitting member 20A is nonreflective to the excitation beam wavelength and also nonreflective to the laser beam wavelength;

the left end surface of the transparent heat transmitting member 20B is nonreflective to the excitation beam wavelength and also nonreflective to the laser beam wavelength; and the right end surface of the transparent heat transmitting member 20B is highly reflective to the excitation beam wavelength and partially reflective to the laser beam wavelength.

In this embodiment, a resonator system is enclosed between the left end surface of the transparent heat transmitting member 20A and the right end surface of the transparent heat transmitting member 20B, and the transparent heat transmitting member 20A and the transparent heat transmitting member 20B are arranged within a resonator in this system.

When the laser medium 10 is made of ceramic, and the transparent heat transmitting members 20A, 20B are made of a single crystal or amorphous, damage resistivity of the microchip laser resonator is improved.

For example, YAG, $YVO_4$, or (s-)FAP with luminescent center element additives may be used as the laser medium 10, additive-free YAG, sapphire, or diamond may be used as the transparent heat transmitting members 20A, 20B. If differences in refractive indexes between the laser medium 10 and the transparent heat transmitting members 20A, 20B are less than 9%, the intermediate layer is not necessary. For example, if the laser medium 10 is YAG or (s-)FAP with the luminescent center element additives, and the transparent heat transmitting members 20A, 20B are additive-free YAG or sapphire, intermediate layer(s) are not necessary.

If a laser medium is $YVO_4$ with the luminescent center substance additives, and transparent heat transmitting members are sapphire, a difference in refractive indexes becomes 19%, in which case the use of the intermediate layer(s) is preferable. It is preferable to use one or more types of sulfa, $SiO_2$, and HfO having refractive indexes being median values of the refractive indexes of the aforementioned members as the intermediate layer(s).

If the laser medium is $YVO_4$ with the luminescent center substance additives, and the transparent heat transmitting members are diamond, it is preferable to use one or more types of $TiO_2$, ZnS, and $Ta_2O_3$ having the refractive indexes being median values of the refractive indexes of the aforementioned members as the intermediate layer(s).

The dielectric multilayer film may be formed between the transparent heat transmitting member 20A and the laser medium 10 and between the transparent heat transmitting member 20B and the laser medium 10. In this case, a homogeneous film having same material with a counterpart bonding surface may be formed on an outermost surface of the dielectric multilayer film to perform the homogeneous surface-active bonding, or the homogeneous film may not be formed to perform the heterogeneous surface-active bonding. In the latter case, an amorphous layer is formed at the bonding interfaces and thereby facilitates the bonding.

When the excitation beam is radiated to the left end surface of the transparent heat transmitting member 20A, this microchip laser resonator outputs the laser beam from the right end surface of the transparent heat transmitting member 20B. Notably, the transparent heat transmitting member 20B on a side that outputs the laser beam may be omitted in some cases.

(Laser Device of Second Embodiment)

Figure 8:
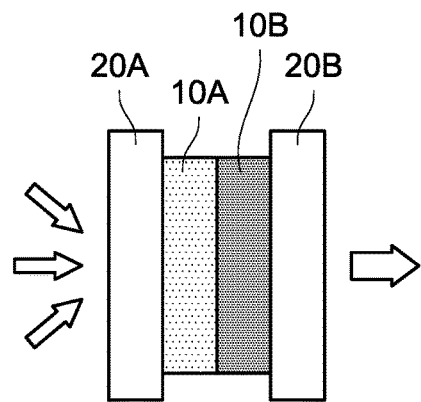
FIG. 8 shows a laser device of a second embodiment.

As shown in FIG. 8, a Q switch 10B may be inserted between the laser medium 10A and the transparent heat transmitting member 20B, and these members may be surface-active bonded. In this case, the surface-active bonding is performed by providing a dielectric multilayer film between the Q switch 10B and the transparent heat transmitting member 20B, and this dielectric multilayer film is adjusted to exhibit a reflection property of being highly reflective to the excitation beam wavelength and being configured to partially reflect the laser beam wavelength. Further, the surface-active bonding is performed by providing a dielectric multilayer film between the laser medium 10A and the transparent heat transmitting member 20A, and this dielectric multilayer film is adjusted to exhibit a reflection property of being nonreflective to the excitation beam wavelength but being configured to reflect the laser beam wavelength. In this case, the transparent heat transmitting members 20A, 20B are located outside the laser resonator system. The transparent heat transmitting members 20A, 20B may be arranged on the inside of the laser resonator system as shown in FIG. 7, or the transparent heat transmitting members 20A, 20B may be arranged on the outside of the laser resonator system as shown in FIG. 8. According to the technique disclosed herein, a bonding interface that maintains its transparency at a degree by which high-power laser can be resonated even if the transparent heat transmitting members are arranged inside the resonator system.

(Laser Device of Third Embodiment)

Figure 9:
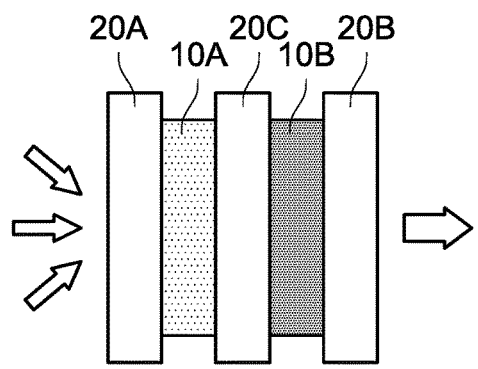
FIG. 9 shows a laser device of a third embodiment.

As shown in FIG. 9, the transparent heat transmitting member 20C may be inserted between the laser medium 10A and the Q switch 10B, and these members may be surface-active bonded.

It is preferable to enlarge a diameter of the transparent heat transmitting members 20A, 20B, 20C to be larger than the diameter of the laser medium 10A and the Q switch 10B. In this case, a relationship is established, in which these serially-bonded laser components are housed in a cylinder having high thermal transmissivity, and outer circumferential surfaces of the transparent heat transmitting members 20A, 20B, 20C contact an inner circumferential surface of the cylinder. Heat from the laser medium 10A is transmitted to the cylinder through the transparent heat transmitting members 20A, 20C. Heat from the Q switch 10B is transmitted to the cylinder through the transparent heat transmitting members 20C, 20B. When the cylinder is cooled, the laser medium 10A and the Q switch 10B are also cooled.

(Laser Device of Fourth Embodiment)

Figure 10:
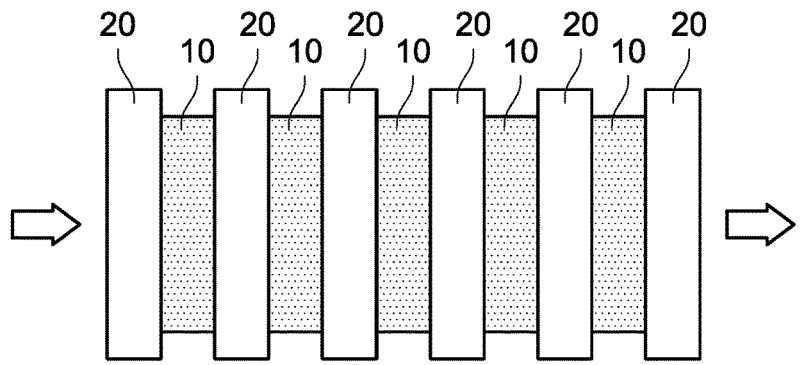
FIG. 10 shows a laser device of a fourth embodiment.

FIG. 10 shows a laser resonator that enabled high-power output by arranging plural sets of the microchip laser resonator of FIG. 7 and connecting them serially. In the following description, if phenomena that occur in the laser mediums 10A, 10B . . . , the laser mediums 10 will be described by omitting the added alphabets in the reference signs. The same is applied to the transparent heat transmitting members 20. In case of FIG. 10, a dielectric multilayer film that is nonreflective to the excitation beam wavelength but highly reflective to the laser beam is formed on the left or right end surface of the transparent heat transmitting member 20 that is located on a leftmost side. A dielectric multilayer film that is highly reflective to the excitation beam wavelength and that partially reflects the laser beam is formed on the left or right end surface of the transparent heat transmitting member 20 that is located on a rightmost side. The transparent heat transmitting member 20 on the leftmost side and the transparent heat transmitting member 20 on the rightmost side may be arranged inside or outside the resonator system, however, remaining transparent heat transmitting members 20 in between are arranged inside the resonator system.

A thickness of each laser medium 10 is preferably equal to or thinner than one-fifth (⅕) of the diameter of the laser medium. When they are thinned to this extent, temperature distribution along an optical path in the laser medium becomes uniformized, and beam quality is significantly improved.

Laser mediums of different types may be arranged serially. For example, when plural types of optical gain materials which added a common luminescence center substance in different types of base materials are arranged serially, a resonating wavelength of the laser resonator can be configured as a broad band as described in SATO et. al. Plural types of optical gain materials with different luminescent center substances may be arranged serially. For example, "Tm:YAG, transparent heat transmitting member, Ho:YAG, and transparent heat transmitting member" may configure a unit, and the plural units may repeatedly be arranged in serial. Due to this, a phenomenon in which light emission from Tm excites Ho can be achieved.

(Laser Device of Fifth Embodiment)

Figure 11:
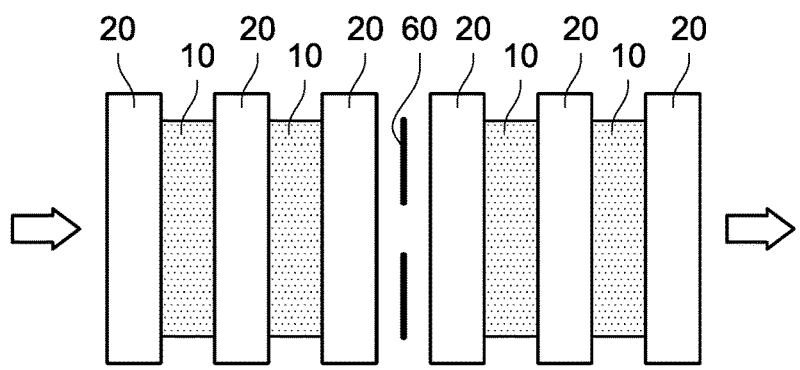
FIG. 11 shows a laser device of a fifth embodiment.

FIG. 11 shows an embodiment in which a spatial modulation element 60 is inserted in the multilevel microchip laser resonator of FIG. 10. The spatial modulation element 60 controls a spatial mode of the laser beam. A hard aperture or a soft aperture may be inserted instead of the spatial modulation element 60. The spatial modulation element 60 and the like may be surface-active bonded to its adjacent material.

(Laser Device of Sixth Embodiment)

Figure 12:
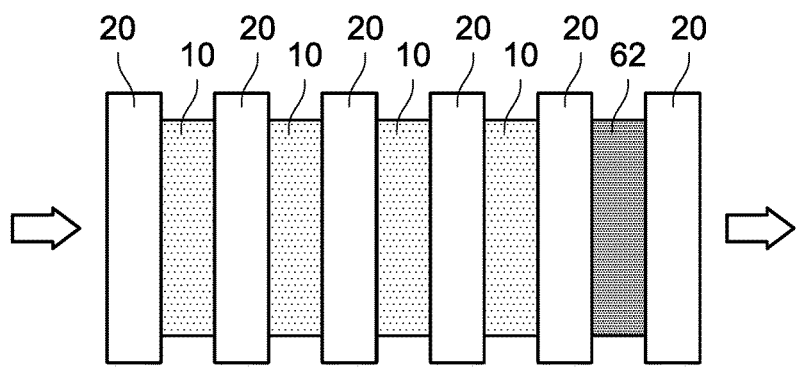
FIG. 12 shows a laser device of a sixth embodiment.

FIG. 12 shows a pulse laser resonator that inserts a Q switch 62 in the multilevel microchip laser resonator of FIG. 10. A saturable element, EO, AO, MO, or a nonlinear optical element may be used instead of the Q switch 62. The Q switch 62 and the like may be surface-active bonded to its adjacent material. Further, in case of a saturable absorbing element, it may be divided into plurality to disperse generated heat accumulation, and they may be bonded in a state where a transparent heat transmitting member is interposed between those divided saturable absorbing elements.

(Laser Device of Seventh Embodiment)

Figure 13:
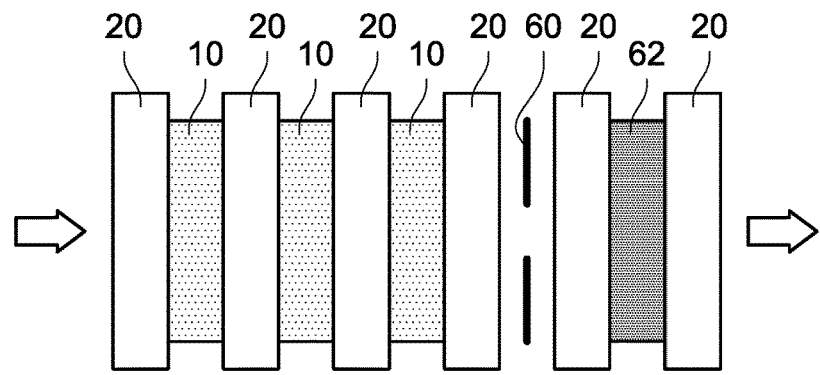
FIG. 13 shows a laser device of a seventh embodiment.

FIG. 13 shows a pulse laser resonator that combined FIGS. 11 and 12.

(Laser Device of Eighth Embodiment)

Figure 14:
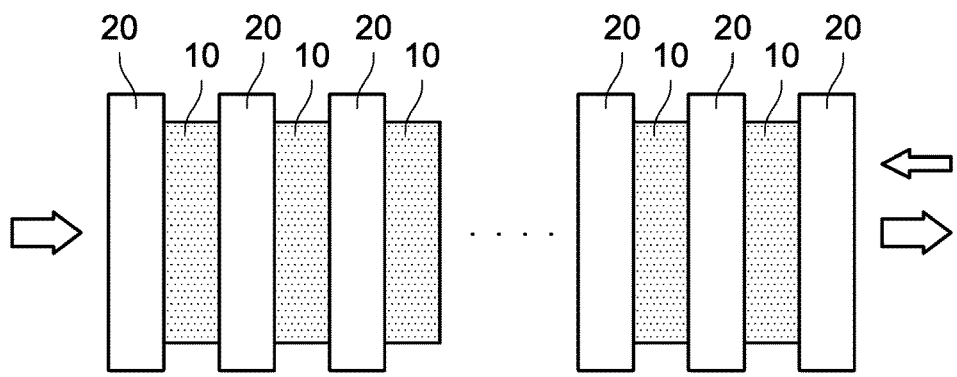
FIG. 14 shows a laser device of an eighth embodiment.

FIG. 14 shows a laser amplifier in which optical gain mediums 10 and transparent heat transmitting members 20 are arranged serially according to an order in which they appear alternately. Adjacent members are each surface-active bonded. The respective interfaces are adjusted to have one of the following reflection properties:

1) all the interfaces are nonreflective to both the excitation beam and laser beam wavelengths. If YAG is used as the optical gain mediums 10 and sapphire is used as the transparent heat transmitting members 20, they may be bonded by heterogeneous surface-active bonding. When YAG and sapphire are surface-active bonded, reflectance at their bond interface becomes 0.1% or less, and there will be no need to provide a nonreflective coating by the dielectric multilayer film or the intermediate layer. Further, YAG and sapphire both contain $Al_2O_3$, which further omits the need of the homogeneous film;

2) one of left and right interfaces of the transparent heat transmitting member 20 that is on the rightmost side is highly reflective to the excitation beam but nonreflective to the laser beam wavelength, and all remaining interfaces are nonreflective to both the excitation beam and the laser beam wavelength; and 3) in the above 1) and 2), one of left and right interfaces of the transparent heat transmitting member 20 that is on the leftmost side is nonreflective to the excitation beam but highly reflective to the laser beam wavelength.

In this device, the left end surface is radiated with the excitation beam, and the input laser beam is inputted from the right end surface. By so doing, a laser beam is outputted from the right end surface. The output laser beam has higher or amplified intensity than that of the input laser beam.

In this embodiment, dopant concentration of the luminescent center element in the optical gain mediums 10 on the left side, where the strong excitation beam radiation is carried out, is set low, and dopant concentration of the luminescent center element in the optical gain mediums 10 on the right side, where the excitation beam attenuates, is set high. Due to this, the excitation beam is not absorbed drastically in localized areas, and an adjustment can be made to uniformize absorption over an entire excitation area. Temperatures inside the laser device can be uniformized, and local overheating can be prevented. Alternatively, portions in vicinities of the respective ends and a center portion of a serial connection may be distinguished, and dopant concentration of the luminescent center element in the portions in vicinities of the respective ends may be set low, and dopant concentration of the luminescent center element in the center portion may be set high. This arrangement is useful when excitation beams radiate both end faces of the serial connection.

Microchip laser, fiber laser, rod laser, and disk laser may be exemplified as source light for the amplifier.

In a device that arranges a plurality of homogeneous laser mediums serially and use them for amplification, amplification rate can be increased. As an alternative thereof, a laser amplifier with different types of laser mediums serially arranged therein is also useful. If a wavelength range of input laser beam is broad, the use of the plural types of laser mediums enables amplification of the entire wavelength range of the input laser beam. In all of the above cases, overheating of the laser mediums can be prevented due to each laser medium being cooled from its both side surfaces.

(Laser Device of Ninth Embodiment)

Figure 15:
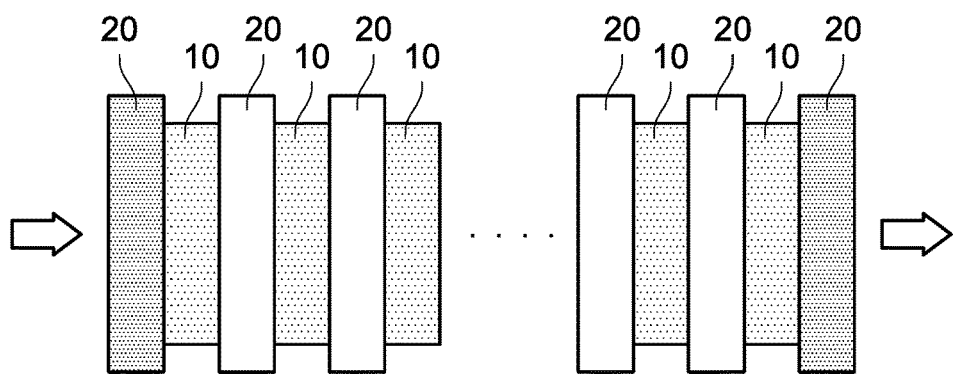
FIG. 15 shows a laser device of a ninth embodiment.

As shown in FIG. 15, a wavelength converter may be constituted by the structure of FIG. 14. In this case, nonlinear optical elements are used as the laser mediums 10 instead of the optical gain mediums. In this case, thicknesses of the nonlinear optical elements may be varied, and such nonlinear optical elements may be arranged serially. By so doing, the input laser beam can be converted to laser beam with broad wavelength widths. Alternatively, conversion to laser beam having a plurality of independent wavelengths may be enabled.

A wavelength converter may be realized using the structure of FIG. 7. A serial connection that bonds a plurality of nonlinear optical materials with different thicknesses may be used as the laser medium 10 of FIG. 7.

Further, the bonding may be performed so that directions of nonlinear polarization is inverted according to a coherence length of a targeted wavelength, or so that quasi-phase matching is realized, in which temporal halts are repeated. In the quasi-phase matching, a chirp structure for expanding the range or controlling a phase relationship may be build therein.

As a resonator profile, a parallel-plate resonator is suitable for high power output than a stable resonator. FIGS. 7 to 13 show parallel-plate resonators. The excitation area needs to be expanded for further increase in the output power, however, the conventional technique had difficulty in expanding the excitation area due to insufficient gain. The laser resonator disclosed herein is capable of expanding the excitation area, since its transparency is high and the overheating is less likely to occur. An unstable cavity resonator can be constructed by utilizing this feature. The technique disclosed herein enables to facilitate the unstable cavity resonator.

The technique that carries out the oxygen plasma exposure prior to the surface-active bonding is especially effective for bonding the laser medium and the transparent heat transmitting member, however, it is not limited to this. For example, it is also effective in cases of bonding a laser medium constituted of oxide to a nontransparent heat transmitting member (metal heat sink such as Cu or CuW). In this case, the dielectric multilayer film is formed on the surface of the laser medium to adjust it to exhibit a property of total reflection. An alumina film, or a metal film such as Au, AuSn is formed on an outermost surface of the dielectric multilayer film. These laser medium and metal heat sink are exposed to the oxygen plasma, and thereafter surface-active bonded. Due to this, thermal resistance between the laser medium and the metal heat sink is maintained low, and bonding reliability is improved.

Further, the pre-processing of exposing to the oxygen plasma may be replaced with another cleaning process, which is a cleaning process with less damage.

The technique disclosed herein is especially effective in cases where at least one of the laser medium and the transparent heat transmitting member is oxide, however, it is not limited thereto, and it is effective also for cases where at least one of the laser medium and the transparent heat transmitting member contains light element. Especially, in cases where the light element included within first to third periods of the periodic table is contained, the transparency and stability of the bonding surface can be improved by subjecting the containing member to the oxygen plasma exposure for pre-washing.

Specific examples of the present invention have been described in detail, however, these are mere exemplary indications and thus do not limit the scope of the claims. For example, the laser mediums and the transparent heat transmitting members appear alternately in the embodiments, however, there are cases where the laser mediums appear consecutively at parts in the serial arrangement. In such a case, the consecutive laser mediums can collectively be regarded as one laser medium. Thus, this is also complying with the rule that the laser mediums and the transparent heat transmitting members appear alternately.

The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A method of manufacturing a laser component having a laser medium and a transparent heat transmitting member, wherein at least one of the laser medium and the transparent heat transmitting member is oxide, the method comprising:
   surface-active bonding a bonding surface of the laser medium and a bonding surface of the transparent heat transmitting member by radiating an inert gas atomic beam to both the bonding surface of the laser medium and the bonding surface of the transparent heat transmitting member in vacuum, and after the radiating bringing the bonding surface of the laser medium and the bonding surface of the transparent heat transmitting member into contact, wherein:
   the laser medium and the transparent heat transmitting member are bonded via an amorphous layer,
   the amorphous layer is composed of a material derived from the laser medium and the transparent heat transmitting member, and is transparent to an excitation beam,
   any colored layer causing an energy loss of 1% or more is not observed in the laser component, and
   the laser component outputs a laser beam having a power greater than 10 MW (megawatts).

2. The method according to claim 1, wherein the bonding surfaces are brought into contact without heating.

3. A laser component comprising a laser medium and a transparent heat transmitting member, wherein
   at least one of the laser medium and the transparent heat transmitting member is oxide, the laser medium and the transparent heat transmitting member are bonded via an amorphous layer formed by surface-active bonding a bonding surface of the laser medium and a bonding surface of the transparent heat transmitting member by radiating an inert gas atomic beam to both the bonding surface of the laser medium and the bonding surface of the transparent heat transmitting member in vacuum, and after the radiating bringing the bonding surface of the laser medium and the bonding surface of the transparent heat transmitting member into contact, the amorphous layer is composed of a material derived from the laser medium and the transparent heat transmitting member, and is transparent to an excitation beam, any colored layer causing an energy loss of 1% or more is not observed in the laser component, and the laser component outputs a laser beam having a power greater than 10 MW (megawatts).

4. The laser component according to claim 3, wherein the laser medium is an optical gain material.

5. The laser component according to claim 3, wherein the laser medium is a nonlinear optical material.

6. The laser component according to claim 3, further comprising:
a dielectric multilayer film provided between the laser medium and the transparent heat transmitting member.

7. The laser component according to claim 3, further comprising:
an intermediate layer provided between the laser medium and the transparent heat transmitting member, wherein
a difference in a refractive index of the laser medium and a refractive index of the intermediate layer is less than 9%,
a difference in the refractive index of the intermediate layer and a refractive index of the transparent heat transmitting member is less than 9%, and
a difference in the refractive index of the laser medium and the refractive index of the transparent heat transmitting member is equal to or more than 9%.

8. The laser component according to claim 3, wherein
a plurality of laser mediums and a plurality of transparent heat transmitting members are provided, and
the plurality of laser mediums and the plurality of transparent heat transmitting members are arranged serially in an order by which the laser mediums and the transparent heat transmitting members appear alternately.

9. The laser component according to claim 8, wherein
a thickness of each laser medium in a laminate direction is equal to or less than one-fifth (1/5) of a diameter of the laser medium.

10. The laser component according to claim 8, wherein
the laser mediums comprise different types of laser mediums, and
the laser mediums of different types are arranged serially.

11. The laser component according to claim 10, wherein
the laser mediums comprise a group of laser mediums having a same luminescent center element and different base materials, and
the group of laser mediums is arranged serially.

12. The laser component according to claim 10, wherein
the laser mediums comprise a group of laser mediums having a same base material and different luminescent center elements, and
the group of laser mediums is arranged serially.

13. The laser component according to claim 10, wherein
the laser mediums comprise a group of laser mediums having different luminescent center elements and different base materials, and
the group of laser mediums is arranged serially.

14. The laser component according to claim 8, wherein
the laser mediums have different dopant concentrations,
the dopant concentration of the laser medium arranged in a vicinity of an end face to be exposed to the excitation beam is lower than the dopant concentration of the laser medium arranged far away from the end face.

15. The laser component according to claim 8, wherein
each of the laser mediums is a nonlinear optical material,
the laser mediums comprise a group of laser mediums having different thicknesses, and
the group of laser mediums is arranged serially.

16. The laser component according to claim 8, wherein
the transparent heat transmitting members are arranged at respective ends of a serial arrangement.

17. The laser component according to claim 16, wherein
each of the transparent heat transmitting members arranged at ends of the serial arrangement is made of a single crystal, and the laser mediums are made of ceramic.

18. The laser component according to claim 17, wherein
end faces of the transparent heat transmitting members arranged at ends of the serial arrangement are coated.

19. The laser component according to claim 3, wherein
the laser medium is made of ceramic, and the transparent heat transmitting member is made of a single crystal.

20. The laser component according to claim 19, wherein
the transparent heat transmitting members are arranged at both end faces of the laser medium.

21. The laser component according to claim 20, wherein
end faces of the transparent heat transmitting members arranged at the end faces of the laser medium are coated.

* * * * *